US008691679B2

(12) United States Patent
Tamaso (10) Patent No.: US 8,691,679 B2
(45) Date of Patent: Apr. 8, 2014

(54) SEMICONDUCTOR DEVICE AND METHOD OF MANUFACTURING THE SAME (75) Inventor: Hideto Tamaso, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/581,980

(22) PCT Filed: Oct. 19, 2011

(86) PCT No.: PCT/JP2011/073996
§ 371 (c)(1),
(2), (4) Date: Aug. 30, 2012

(87) PCT Pub. No.: WO2012/060223
PCT Pub. Date: May 10, 2012

(65) Prior Publication Data
US 2012/0326167 A1 Dec. 27, 2012

(30) Foreign Application Priority Data
Nov. 1, 2010 (JP) ................................. 2010-245150

(51) Int. Cl.
*H01L 21/3205* (2006.01)
*H01L 29/161* (2006.01)

(52) U.S. Cl.
USPC ........................................................ 438/586

(58) Field of Classification Search
USPC .............. 257/77, E29.084, E21.294; 438/586
See application file for complete search history.

(56) References Cited

U.S. PATENT DOCUMENTS

| 6,110,813 A | 8/2000 | Ota et al. |
| 6,274,889 B1 | 8/2001 | Ota et al. |
| 8,373,176 B2 * | 2/2013 | Tamaso ........................... 257/77 |
| 2005/0104072 A1 * | 5/2005 | Slater et al. ..................... 257/77 |
| 2010/0193799 A1 * | 8/2010 | Nakano et al. ................... 257/77 |
| 2011/0031506 A1 | 2/2011 | Tamaso |
| 2011/0031507 A1 | 2/2011 | Tamaso |
| 2011/0175111 A1 | 7/2011 | Harada et al. |

FOREIGN PATENT DOCUMENTS

| JP | 10-284436 | 10/1998 |
| JP | 2004-158702 | 6/2004 |
| JP | 2010-087397 | 4/2010 |
| WO | WO-2009/128419 A1 | 10/2009 |

OTHER PUBLICATIONS

WO2009/128382.*

* cited by examiner

*Primary Examiner* — Whitney T Moore
(74) *Attorney, Agent, or Firm* — Venable LLP; Michael A. Sartori; Tamatane J. Aga (57) ABSTRACT A silicon carbide substrate has a substrate surface. A gate insulating film is provided to cover a part of the substrate surface. A gate electrode covers a part of the gate insulating film. A contact electrode is provided on the substrate surface, adjacent to and in contact with the gate insulating film, and it contains an alloy having Al atoms. Al atoms do not diffuse from the contact electrode into a portion of the gate insulating film lying between the substrate surface and the gate electrode. Thus, in a case where a contact electrode having Al atoms is employed, reliability of the gate insulating film of a semiconductor device can be improved.

4 Claims, 6 Drawing Sheets

FIG.11

SEMICONDUCTOR DEVICE AND METHOD OF MANUFACTURING THE SAME

TECHNICAL FIELD

The present invention relates to a semiconductor device and a method of manufacturing the same, and more particularly to a semiconductor device having a silicon carbide substrate and a method of manufacturing the same.

BACKGROUND ART

WO2009/128419 (PTL 1) discloses a material containing titanium (Ti) and aluminum (Al) as a material for an ohmic contact electrode arranged in contact with an SiC wafer (a silicon carbide substrate). According to this publication, contact resistance with the SiC wafer can be lowered by applying the material above.

CITATION LIST

Patent Literature

PTL1: WO2009/128419

SUMMARY OF INVENTION

Technical Problem

In a case where a contact electrode having Al atoms is arranged in contact with a gate insulating film, Al atoms in the contact electrode are likely to diffuse into the gate insulating film during annealing treatment, which may result in lowering in reliability of electrical isolation between a gate electrode and a silicon carbide substrate.

Then, an object of the present invention is to provide a semiconductor device capable of improving reliability of a gate insulating film of the semiconductor device in a case where a contact electrode having Al atoms is employed and a method of manufacturing the same.

Solution to Problem

A semiconductor device according to the present invention includes a silicon carbide substrate, a gate insulating film, a gate electrode, and a contact electrode. The silicon carbide substrate has a substrate surface. The gate insulating film is provided to cover a part of the substrate surface. The gate electrode covers a part of the gate insulating film. The contact electrode is provided on the substrate surface, adjacent to and in contact with the gate insulating film, and contains an alloy having Al atoms. Al atoms do not diffuse from the contact electrode into a portion of the gate insulating film lying between the substrate surface and the gate electrode.

According to this semiconductor device, Al atoms do not diffuse from the contact electrode into the portion of the gate insulating film lying between the substrate surface and the gate electrode. Therefore, reliability of electrical isolation between the gate electrode and the silicon carbide substrate is enhanced.

Preferably, the gate insulating film contains silicon oxide. More preferably, the silicon oxide includes silicon dioxide.

Preferably, the contact electrode has Ti atoms. Thus, contact resistance of the contact electrode to the silicon carbide substrate can be lowered.

A method of manufacturing a semiconductor device according to the present invention has the following steps.

A silicon carbide substrate having a substrate surface is prepared. A gate insulating film is formed to cover a part of the substrate surface. A contact electrode having Al atoms is formed on the substrate surface, adjacent to and in contact with the gate insulating film. An alloy having Al atoms is formed by annealing the contact electrode with laser beams. A gate electrode covering a part of the gate insulating film is formed.

According to this manufacturing method, since the contact electrode is annealed with laser beams, annealing is carried out by local heating in a period of time shorter than in a case where other annealing methods are employed. Thus, since a distance of diffusion of Al atoms in the contact electrode into the gate insulating film is suppressed, Al atoms can be prevented from reaching the portion of the gate insulating film lying between the substrate surface and the gate electrode. Thus, reliability of electrical isolation between the gate electrode and the silicon carbide substrate is enhanced.

Preferably, the gate insulating film contains silicon oxide. More preferably, the silicon oxide includes silicon dioxide.

Preferably, the contact electrode has Ti atoms. Thus, contact resistance of the contact electrode to the silicon carbide substrate can be lowered.

Preferably, the laser beam has a wavelength not longer than 386 nm. Thus, laser beams have photon energy not less than energy corresponding to a band gap of silicon carbide of a poly type of 4H. Therefore, since laser beams are more reliably absorbed in a surface of the silicon carbide substrate, annealing can more efficiently be carried out.

Advantageous Effects of Invention

As is clear from the description above, according to the present invention, reliability of electrical isolation between a gate electrode and a silicon carbide substrate is enhanced.

DESCRIPTION OF EMBODIMENTS

An embodiment of the present invention will be described hereinafter with reference to the drawings.

Initially, a construction of a MOSFET (Metal Oxide Semiconductor Field Effect Transistor) in the present embodiment will generally be described.

Figure 1:
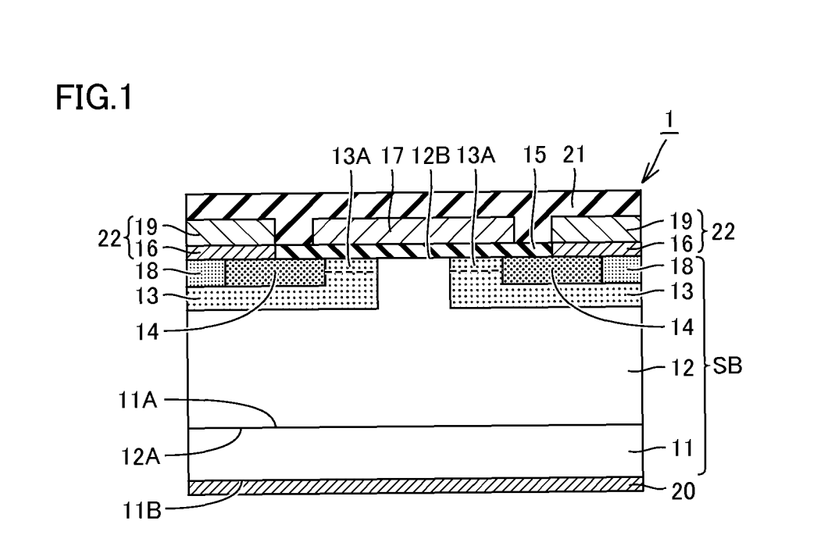
FIG. 1 is a cross-sectional view schematically showing a construction of a semiconductor device in one embodiment of the present invention.

Referring to FIG. 1, a MOSFET 1 has a silicon carbide substrate SB, a gate insulating film 15, a gate electrode 17, a source electrode 22, a passivation film 21, and a drain electrode 20. Source electrode 22 has a contact electrode 16 and a source interconnection 19. Silicon carbide substrate SB has a substrate surface 12B. Gate insulating film 15 is provided to cover a part of substrate surface 12B. Gate electrode 17 covers a part of gate insulating film 15. Contact electrode 16 is provided on substrate surface 12B, adjacent to and in contact with gate insulating film 15. In addition, contact electrode 16 contains an alloy having Al atoms. Al atoms do not diffuse from contact electrode 16 into a portion of gate insulating film 15 lying between substrate surface 12B and gate electrode 17.

For example, an alloy of Al and at least any of Ti, Ni, and Si can be employed as the alloy having Al atoms described above. In addition, for example, an $SiO_2$ film, an SiON film, or an ONO film can be employed as gate insulating film 15. Here, the ONO film refers to a film having a three-layered structure of oxide film-nitride film-oxide film. $SiO_2$ can be used for this oxide film and $Si_3N_4$ can be used for this nitride film.

Details of the construction of MOSFET 1 will now be described.

MOSFET 1 includes an $n^+$ SiC wafer 11 being a wafer composed of silicon carbide (SiC) and having an n conductivity type (a first conductivity type), an $n^-$ SiC layer 12 serving as a semiconductor layer composed of SiC and having the n conductivity type (the first conductivity type), a pair of p bodies 13 serving as second-conductivity-type regions having a p conductivity type (a second conductivity type), an $n^+$ source region 14 serving as a high-concentration first-conductivity-type region having the n conductivity type (the first conductivity type), and a $p^+$ region 18 serving as a high-concentration second-conductivity-type region having the p conductivity type (the second conductivity). $N^-$ SiC layer 12 having p bodies 13, $n^+$ source regions 14, and $p^+$ regions 18 formed therein and $n^+$ SiC wafer 11 constitute silicon carbide substrate SB composed of silicon carbide. $N^+$ SiC wafer 11 contains an n-type impurity (an impurity having the n conductivity type) such as N (nitrogen) at high concentration.

$N^-$ SiC layer 12 is formed on one main surface 11A of $n^+$ SiC wafer 11, for example, to a thickness of approximately 10 µm, and it has the n conductivity type by containing an n-type impurity. Examples of n-type impurities contained in $n^-$ SiC layer 12 include N (nitrogen), and an impurity is contained at concentration lower than concentration of an n-type impurity contained in $n^+$ SiC wafer 11, for example, at concentration of $5 \times 10^{15}$ cm$^{-3}$.

A pair of p bodies 13 is formed such that the p bodies are separate from each other so as to include substrate surface 12B in $n^-$ SiC layer 12, and the pair has the p conductivity type (the second conductivity type) by containing a p-type impurity (an impurity having the p conductivity type). For example, Al, B (boron), or the like is adopted as a p-type impurity to be contained in p body 13, and it is contained at concentration lower than concentration of the n-type impurity contained in $n^+$ SiC wafer 11, for example, at concentration of $1 \times 10^{17}$ cm$^{-3}$.

$N^+$ source region 14 is formed within each p body 13 so as to include substrate surface 12B and to be surrounded by p body 13. $N^+$ source region 14 contains an n-type impurity such as P (phosphorus) at concentration higher than concentration of the n-type impurity contained in $n^-$ SiC layer 12, for example, at concentration of $1 \times 10^{20}$ cm$^{-3}$.

$P^+$ region 18 is formed to include substrate surface 12B, on the side opposite to $n^+$ source region 14 formed within the other p body 13, when viewed from $n^+$ source region 14 formed within one p body 13 of the pair of p bodies 13. $P^+$ region 18 contains a p-type impurity such as Al or B at concentration higher than concentration of the p-type impurity contained in p body 13, for example, at concentration of $1 \times 10^{20}$ cm$^{-3}$.

MOSFET 1 further includes gate insulating film 15, gate electrode 17, a pair of contact electrodes 16, source interconnection 19, drain electrode 20, and passivation film 21.

Gate insulating film 15 is formed on substrate surface 12B of $n^-$ SiC layer 12 so as to be in contact with substrate surface 12B and to extend from an upper surface of one $n^+$ source region 14 to an upper surface of the other $n^+$ source region 14. Gate insulating film 15 contains silicon oxide and the silicon oxide includes silicon dioxide ($SiO_2$). Namely, gate insulating film 15 is, for example, a silicon dioxide film.

Gate electrode 17 is arranged in contact with gate insulating film 15 so as to extend from one $n^+$ source region 14 to the other $n^+$ source region 14 over the same. In addition, gate electrode 17 is made of a conductor such as polysilicon, Al, or the like.

Contact electrode 16 is arranged in contact with substrate surface 12B, so as to extend from a pair of $n^+$ source regions 14, in a direction away from gate insulating film 15, to $p^+$ region 18. Then, contact electrode 16 is composed of titanium (Ti) atoms, aluminum (Al) atoms, silicon (Si) atoms, and carbon (C) atoms as well as a remaining inevitable impurity. Here, the inevitable impurity includes oxygen (O) atoms inevitably introduced during the manufacturing process. Then, contact electrode 16 has aluminum atoms and titanium atoms in a region including an interface with $n^-$ SiC layer 12 where source region 14 and $p^+$ region 18 are formed.

Source interconnection 19 is formed in contact with contact electrode 16 and it is made of a conductor such as Al. Source interconnection 19 is electrically connected to $n^+$ source region 14 through contact electrode 16. This source interconnection 19 and contact electrode 16 constitute source electrode 22.

Drain electrode 20 is formed in contact with the other main surface 11B of $n^+$ SiC wafer 11, which is a main surface opposite to one main surface 11A which is a main surface on a side where $n^-$ SiC layer 12 is formed. For example, this drain electrode 20 may be structured similarly to contact electrode 16 above, or it may be made of another material capable of establishing ohmic contact with $n^+$ SiC wafer 11, such as Ni. Thus, drain electrode 20 is electrically connected to $n^+$ SiC wafer 11.

Passivation film 21 is formed to extend from one source interconnection 19 over gate electrode 17 to the other source interconnection 19. This passivation film 21 is composed, for example, of $SiO_2$ and it has a function to electrically isolate source interconnection 19 and gate electrode 17 from outside and to protect MOSFET 1.

An operation of MOSFET 1 will now be described. Referring to FIG. 1, in such a state that a voltage not higher than a threshold value is applied to gate electrode 17, that is, in an OFF state, a portion between p body 13 located directly under gate insulating film 15 and $n^-$ SiC layer 12 is reverse-biased and in a non-conducting state. On the other hand, as a positively increasing voltage is applied to gate electrode 17, an inversion layer is formed in a channel region 13A, which is a region around a portion of contact of p body 13 with gate insulating film 15. Consequently, $n^+$ source region 14 and $n^-$ SiC layer 12 are electrically connected to each other and a current flows between source electrode 22 and drain electrode 20.

A method of manufacturing MOSFET 1 will now be described.

Figure 2:
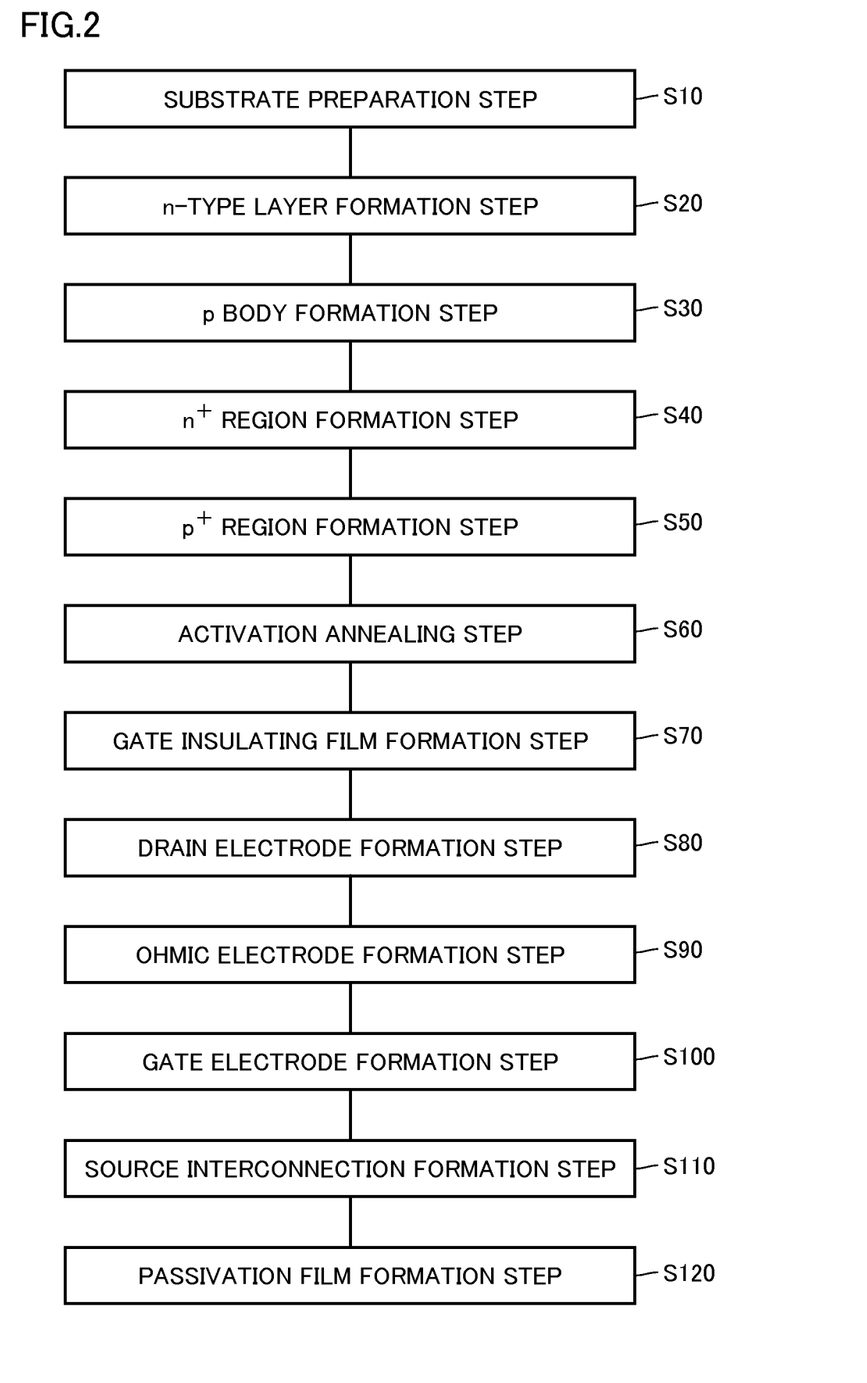
FIG. 2 is a flowchart showing outlines of a method of manufacturing a semiconductor device in FIG. 1.
Figure 4:
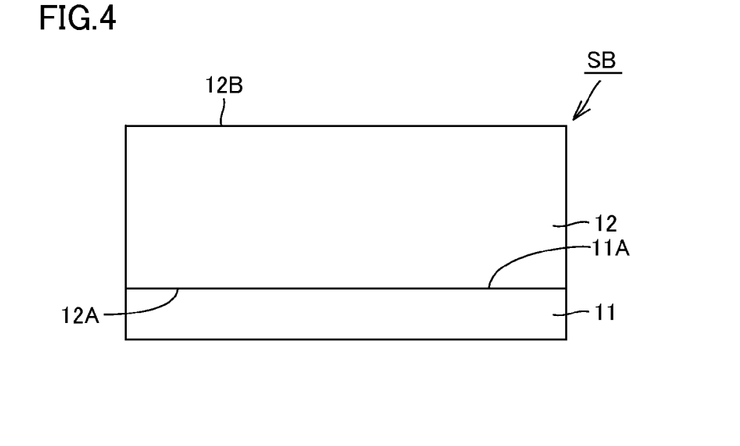
FIG. 4 is a cross-sectional view schematically showing a first step in the method of manufacturing a semiconductor device in FIG. 1.

Referring to FIG. 2, initially, in a step (S10), a substrate preparation step is performed. In this step (S10), an SiC wafer of the first conductivity type is prepared. Specifically, referring to FIG. 4, for example, $n^+$ SiC wafer 11 composed of hexagonal SiC and having the n conductivity type by containing an n-type impurity is prepared.

Referring next to FIG. 2, in a step (S20), an n-type layer formation step is performed. In this step (S20), a semiconductor layer of the first conductivity type is formed on $n^+$ SiC wafer 11. Specifically, referring to FIG. 4, $n^-$ SiC layer 12 is formed on one main surface 11A of $n^+$ SiC wafer 11 through epitaxial growth. Epitaxial growth can be achieved, for example, by adopting a gas mixture of $SiH_4$ (silane) and $C_3H_8$ (propane) as a source gas. Here, for example, N is introduced as the n-type impurity. Thus, $n^-$ SiC layer 12 containing an n-type impurity at concentration lower than concentration of an n-type impurity contained in $n^+$ SiC wafer 11 can be formed.

Figure 5:
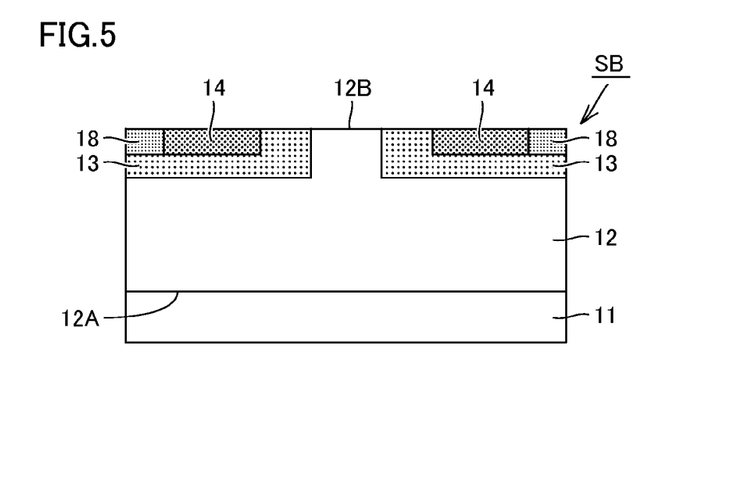
FIG. 5 is a cross-sectional view schematically showing a second step in the method of manufacturing a semiconductor device in FIG. 1.

Referring next to FIG. 2, in a step (S30), a p body formation step is performed. In this step (S30), referring to FIG. 5, a second-conductivity-type region having the second conductivity type is formed so as to include substrate surface 12B of $n^-$ SiC layer 12. Specifically, initially, an oxide film composed of $SiO_2$ is formed on substrate surface 12B, for example, with CVD (Chemical Vapor Deposition). Then, after a resist is applied onto the oxide film, exposure and development are performed to thereby form a resist film having an opening in a region in conformity with a desired shape of p body 13 serving as the second-conductivity-type region. Using this resist film as a mask, the oxide film is partially removed, for example, through RIE (Reactive Ion Etching), and a mask layer formed of the oxide film having an opening pattern is formed on $n^-$ SiC layer 12. Thereafter, the resist film above is removed. Then, using this mask layer as a mask, ion implantation of a p-type impurity such as Al in $n^-$ SiC layer 12 is performed, to thereby form p body 13 in $n^-$ SiC layer 12.

Referring next to FIG. 2, in a step (S40), an $n^+$ region formation step is performed. In this step (S40), a high-concentration first-conductivity-type region containing an impurity having the first conductivity type at concentration higher than in $n^-$ SiC layer 12 is formed in a region within p body 13 including substrate surface 12B. Specifically, referring to FIG. 5, initially, after the oxide film above used as the mask in the step (S30) is removed, a mask layer having an opening in a region in conformity with a desired shape of $n^+$ source region 14 is formed in accordance with a procedure similar to the step (S30). Using this mask layer as a mask, an n-type impurity such as P is introduced in $n^-$ SiC layer 12 through ion implantation, to thereby form $n^+$ source region 14.

Referring next to FIG. 2, in a step (S50), a $p^+$ region formation step is performed. In this step (S50), referring to FIG. 5, a high-concentration second-conductivity-type region ($p^+$ region 18) is formed to include substrate surface 12B on the side opposite to $n^+$ source region 14 formed within the other p body 13, when viewed from $n^+$ source region 14 formed within one p body 13 of the pair of p bodies 13. Specifically, referring to FIG. 5, a mask layer having an opening in a region in conformity with a desired shape of $p^+$ region 18 is formed in accordance with a procedure similar to the steps (S30) and (S40), and using this mask layer as a mask, a p-type impurity such as Al or B is introduced in $n^-$ SiC layer 12 through ion implantation, to thereby form $p^+$ region 18.

Referring next to FIG. 2, in a step (S60), an activation annealing step is performed. In this step (S60), activation annealing which is heat treatment for activating an impurity introduced through ion implantation above is performed by heating $n^-$ SiC layer 12 in which ions have been implanted to a temperature around 1700° C., for example, in an Ar (argon) atmosphere and holding the layer for approximately 30 minutes.

Figure 6:
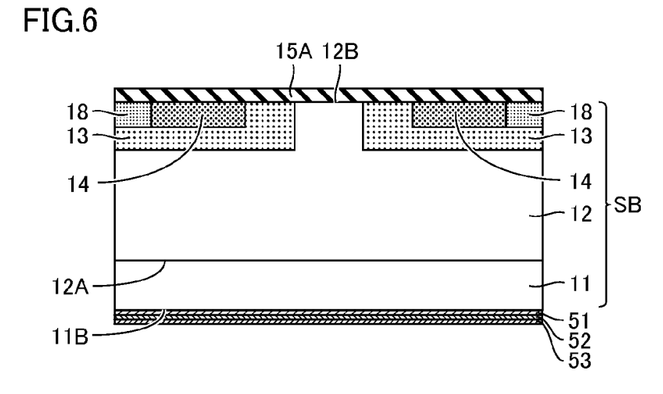
FIG. 6 is a cross-sectional view schematically showing a third step in the method of manufacturing a semiconductor device in FIG. 1.

Referring next to FIG. 2, in a step (S70), a gate insulating film formation step is performed. In this step (S70), referring to FIG. 6, $n^+$ SiC wafer 11 on which $n^-$ SiC layer 12 including a desired ion implantation region has been formed through the steps (S10) to (S60) is subjected to thermal oxidation. Thermal oxidation can be performed, for example, by heating the substrate to a temperature around 1300° C. in an oxygen atmosphere and holding the substrate for approximately 40 minutes. Thus, a thermal oxide film 15A to serve as gate insulating film 15 (see FIG. 1) composed of silicon dioxide ($SiO_2$) (for example, having a thickness of approximately 50 nm) is formed on substrate surface 12B.

Referring next to FIG. 2, in a step (S80), a drain electrode formation step is performed. In the step (S80), referring to FIG. 6, a Ti film 51 composed of Ti, an Al film 52 composed of Al, and an Si film 53 composed of Si are formed in this order on main surface 11B of $n^+$ SiC wafer 11. Then, the step of alloying this stack film is performed. Specifically, heat treatment is performed, in which heating to a temperature not lower than 550° C. and not higher than 1200° C., preferably not lower than 900° C. and not higher than 1100° C., for example 1000° C., in an atmosphere of an inert gas such as Ar is carried out and holding for a time period not longer than 10 minutes, for example 2 minutes, is carried out. Thus, Ti, Al and Si contained in Ti film 51, Al film 52 and Si film 53 respectively as well as Si and C contained in $n^+$ SiC wafer 11 are alloyed. Consequently, as shown in FIG. 7, drain electrode 20 is formed.

Referring next to FIG. 2, in a step (S90), an ohmic electrode formation step is performed. In the step (S90), referring to FIG. 3, initially, in steps (S91) to (S93), a Ti film formation step, an Al film formation step and an Si film formation step are performed in this order.

Figure 7:
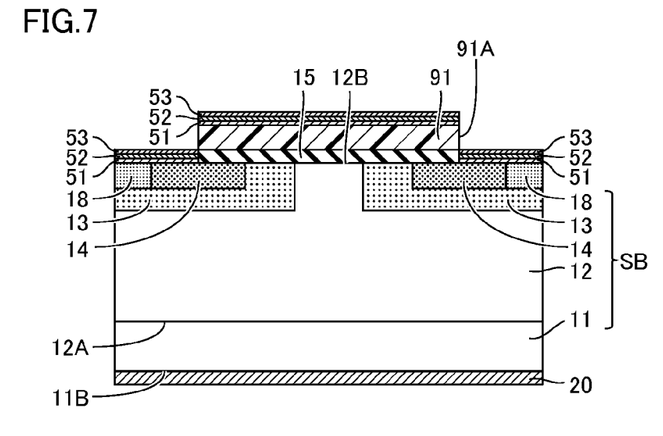
FIG. 7 is a cross-sectional view schematically showing a fourth step in the method of manufacturing a semiconductor device in FIG. 1.
Figure 8:
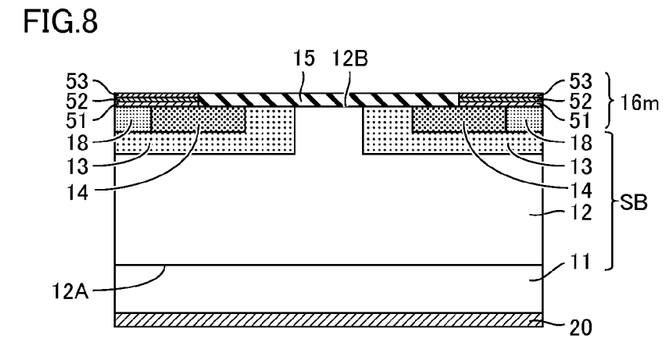
FIG. 8 is a cross-sectional view schematically showing a fifth step in the method of manufacturing a semiconductor device in FIG. 1.

Specifically, referring to FIG. 7, initially, after a resist is applied onto thermal oxide film 15A, exposure and development are performed to thereby form a resist film 91 having an opening 91A in conformity with a region where contact electrode 16 (see FIG. 1) is to be formed. Then, using resist film 91 as a mask, gate insulating film 15 covering a part of substrate surface 12B is formed as a result of partial removal of thermal oxide film 15A, for example, through RIE. Thereafter, Ti film 51 composed of Ti, Al film 52 composed of Al, and Si film 53 composed of Si are formed in this order on substrate surface 12B, for example, through sputtering. In addition, as a result of removal of resist film 91, Ti film 51, Al film 52 and Si film 53 on resist film 91 are removed (lifted off), so that Ti film 51, Al film 52 and Si film 53 remain on substrate surface 12B exposed through gate insulating film 15 as shown in FIG. 8. Thus, a contact electrode 16m to subsequently serve as contact electrode 16 (FIG. 1) is formed on substrate surface 12B, adjacent to and in contact with gate insulating film 15.

Here, in the step (S91), Ti film 51 having a thickness not smaller than 100 Å and not greater than 400 Å is preferably formed. Thus, an ohmic contact electrode having low resistance in a stable manner can be formed. In addition, in the step (S92), Al film 52 at least 1.5 times and at most 6 times as thick as Ti film 51 formed in the step (S91) is preferably formed. Thus, contact electrode 16 further reliably achieving low contact resistance with n+ source region 14 and p body 13 can be fabricated. Moreover, in the step (S93), Si film 53 having a thickness not smaller than 100 Å and not greater than 500 Å is preferably formed. Thus, an ohmic contact electrode having low resistance in a stable manner can be formed.

Figure 3:
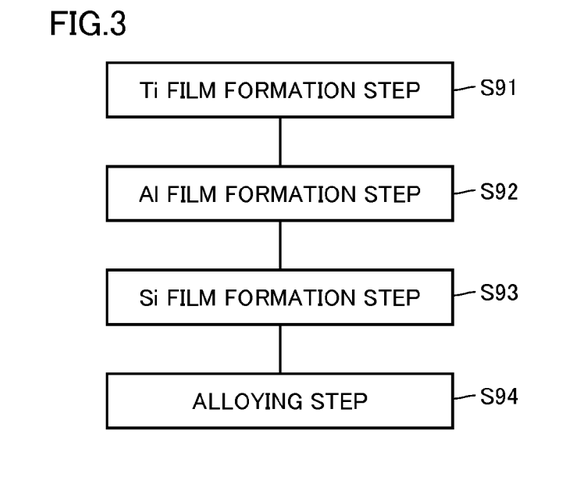
FIG. 3 is a flowchart showing details of an ohmic electrode formation step in FIG. 2.
Figure 9:
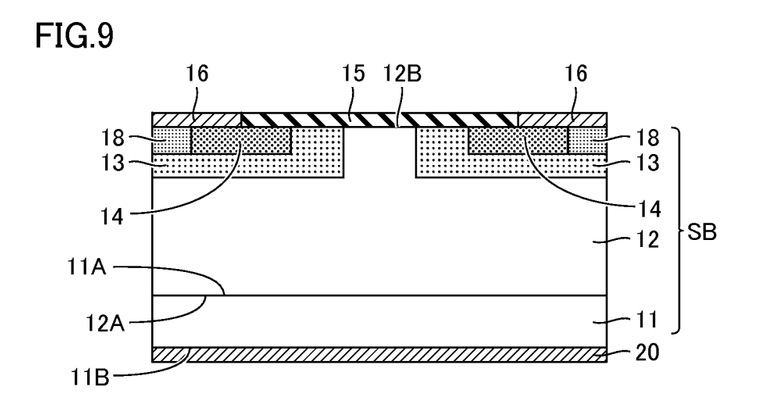
FIG. 9 is a cross-sectional view schematically showing a sixth step in the method of manufacturing a semiconductor device in FIG. 1.

Referring next to FIG. 3, in a step (S94), an alloying step is performed. Specifically, referring to FIGS. 8 and 9, contact electrode 16m is annealed with laser beams in an atmosphere of such an inert gas as Ar. Thus, Ti, Al and Si contained in Ti film 51, Al film 52 and Si film 53 respectively as well as Si and C contained in n− SiC layer 12 are alloyed. Consequently, as shown in FIG. 9, contact electrode 16 arranged in contact with substrate surface 12B, extending from the pair of n+ source regions 14 in a direction away from gate insulating film 15 to p+ region 18, is formed.

Here, since annealing with laser beams is carried out by local heating for an extremely short period of time, a distance of diffusion of atoms during annealing is small. Therefore, Al atoms do not diffuse from contact electrode 16m into a portion of gate insulating film 15 which will subsequently lie between substrate surface 12B and gate electrode 17 (FIG. 1).

Here, in the step (S94), n+ SiC wafer 11 is preferably heated in a gas mixture of an inert gas, in particular, Ar and/or $N_2$, and hydrogen. Thus, contact electrode 16, with its contact resistance with n+ source region 14 and p body 13 (p+ region 18) being further reliably lowered and manufacturing cost being suppressed, can be fabricated. The step (S90) is completed in the procedure above.

Referring next to FIG. 2, in a step (S100), a gate electrode formation step is performed. In this step (S100), referring again to FIG. 1, gate electrode 17 covering a part of gate insulating film 15 is formed. An end portion of gate electrode 17 is arranged at a distance from an end portion of gate insulating film 15. Specifically, gate electrode 17 composed of a conductor such as polysilicon or Al is formed directly on gate insulating film 15 so as to extend from one n+ source region 14 to the other n+ source region 14 over the same. In an example where polysilicon is adopted as a material for a gate electrode, polysilicon can contain P at high concentration exceeding $1\times10^{20}$ cm$^{-3}$.

Referring next to FIG. 2, in a step (S110), a source interconnection formation step is performed. In this step (S110), source interconnection 19 (see FIG. 1) composed of a conductor such as Al is formed on the upper surface of contact electrode 16, for example, with a vapor deposition method. Source electrode 22 (see FIG. 1) is completed in the step (S90) described above and this step (S110).

Referring next to FIG. 2, in a step (S120), a passivation film formation step is performed. In this step (S120), referring to FIG. 1, this passivation film 21 composed, for example, of $SiO_2$, is formed to extend from one source interconnection 19 over gate electrode 17 to the other source interconnection 19. This passivation film 21 can be formed, for example, with a CVD method. MOSFET 1 (see FIG. 1) is completed through the steps (S10) to (S120) above.

According to MOSFET 1 in the present embodiment, Al atoms do not diffuse from contact electrode 16 into the portion of gate insulating film 15 lying between substrate surface 12B and gate electrode 17. Therefore, reliability of electrical isolation between gate electrode 17 and silicon carbide substrate SB is enhanced.

In addition, according to the method of manufacturing MOSFET 1 in the present embodiment, since contact electrode 16m is annealed with laser beams, annealing is carried out by local heating in a period of time shorter than in a case where other annealing methods are employed. Thus, since a distance of diffusion of Al atoms in contact electrode 16m into gate insulating film 15 is suppressed, Al atoms can be prevented from reaching the portion of gate insulating film 15 lying between the substrate surface and gate electrode 17. Thus, reliability of electrical isolation between gate electrode 17 and silicon carbide substrate SB is enhanced.

Preferably, the laser beams have a wavelength not longer than 386 nm. For example, a laser beam which is a third harmonic of YAG laser is employed. Thus, laser beams have photon energy not less than energy corresponding to a band gap of silicon carbide of a poly type of 4H. Therefore, since laser beams are more reliably absorbed in a surface of silicon carbide substrate SB, annealing can more efficiently be carried out.

Laser beams have a pulse width not greater than 10 μs and more preferably not greater than 100 ns. Thus, annealing can be carried out in a further shorter period of time. Therefore, diffusion of Al atoms can further reliably be suppressed.

Energy density of laser beams per one pulse is preferably not less than 0.3 J/cm$^2$ and not more than 1.5 J/cm$^2$ and more preferably not less than 0.5 J/cm$^2$ and not more than 1.3 J/cm$^2$. Thus, alloying by annealing can sufficiently proceed and diffusion of Al atoms can be suppressed.

In the description above, a region of gate insulating film 15 into which Al atoms do not diffuse refers to a region into which Al atoms do not substantially diffuse. In other words, it refers to a region of gate insulating film 15 into which Al atoms do not substantially diffuse from contact electrode 16. A boundary between the region into which Al atoms do not substantially diffuse and a region into which Al atoms substantially diffuse can be delimited, for example, through observation using an optical microscope. This observation example using a test pattern will be described below.

In a first example (FIG. 10), a manner of thermal diffusion of Al atoms during annealing of a Ti/Al pattern 101 embedded in a silicon dioxide film was observed with an optical microscope. The silicon dioxide film and Ti/Al pattern 101 correspond to gate insulating film 15 and contact electrode 16 described above, respectively. According to this observation, the silicon dioxide film could be divided into a first region DF and a second region ND based on a noticeable difference in lightness. Al concentration in each of first region DF and the second region was measured with a composition analysis method. Then, it was found that first region DF had a high Al concentration value, second region ND was noticeably lower in Al concentration value than first region DF, and Al atoms did not substantially diffuse into second region ND. It is noted that energy dispersive X-ray diffraction, Auger electron spectroscopy, and secondary ion mass spectrometry were used as a composition analysis method.

In a second example (FIG. 11), a manner of thermal diffusion of Al atoms during annealing of an Al pattern 102 embedded in a silicon dioxide film was observed with an optical microscope. The silicon dioxide film and Al pattern 102 correspond to gate insulating film 15 and contact electrode 16 described above, respectively. According to this observation as well, the silicon dioxide film could be divided into first region DF and second region ND based on a noticeable difference in lightness.

Figure 10:
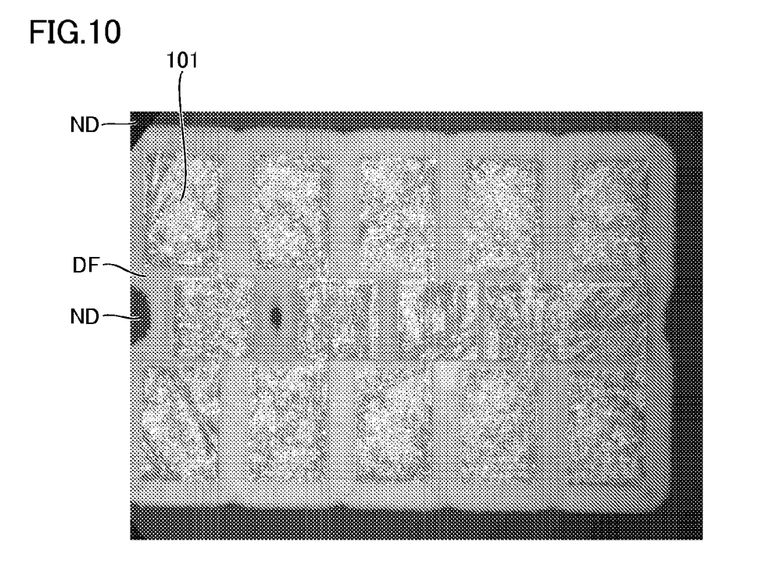
FIG. 10 is an optical micrograph showing a manner of thermal diffusion of Al atoms in annealing of a Ti/Al pattern embedded in a silicon dioxide film.
Figure 11:
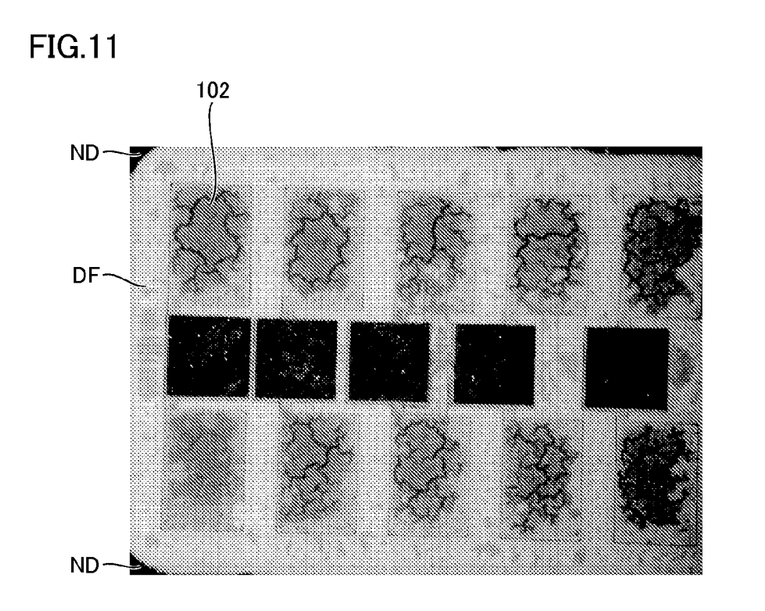
FIG. 11 is an optical micrograph showing a manner of thermal diffusion of Al atoms in annealing of an Al pattern embedded in a silicon dioxide film.

When the first and second examples are compared with each other, in the first example, first region DF extended to a lesser extent. Thus, it was found that a distance of diffusion of Al atoms into the silicon dioxide film was smaller from Ti/Al pattern 101 than from Al pattern 102. Therefore, it was found that, by using Ti/Al as a material for contact electrode 16, a distance of diffusion of Al atoms from contact electrode 16 into gate insulating film 15 could be suppressed as compared with a case of using Al.

It should be understood that the embodiments and the examples disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

11 $n^+$ SiC wafer; 12 $n^-$ SiC layer; 12B substrate surface; 13 p body; 13A channel region; 14 $n^+$ source region; 15 gate insulating film; 15A thermal oxide film; 16,16m contact electrode; 17 gate electrode; 18 $p^+$ region; 19 source interconnection; 20 drain electrode; 21 passivation film; 22 source electrode; 51 Ti film; 52 Al film; and 53 Si film.

The invention claimed is:

1. A method of manufacturing a semiconductor device, comprising the steps of:
   preparing a silicon carbide substrate having a substrate surface;
   forming a gate insulating film to cover a part of said substrate surface,
   said step of forming a gate insulating film including the steps of
   forming an insulating film having a portion to serve as said gate insulating film,
   forming a resist film having an opening on said insulating film, and
   partially removing said insulating film to form said gate insulating film, by using said resist film as a mask;
   forming a contact electrode having Al atoms on said substrate surface, adjacent to and in contact with said gate insulating film,
   said step of forming a contact electrode including the steps of
   forming a Ti film on said silicon substrate provided with said gate insulating film,
   forming an Al film on said Ti film, and
   forming an Si film on said Al film;
   forming an alloy having Al atoms by annealing said contact electrode with laser beams, wherein the energy density of the laser beams per one pulse is not less than 0.3 J/cm$^2$ and not more than 1.5 J/cm$^2$; and
   forming a gate electrode covering a part of said gate insulating film.

2. The method of manufacturing a semiconductor device according to claim 1, wherein
   said gate insulating film contains silicon oxide.

3. The method of manufacturing a semiconductor device according to claim 2, wherein
   said silicon oxide includes silicon dioxide.

4. The method of manufacturing a semiconductor device according to claim 1, wherein
   said laser beam has a wavelength not longer than 386 nm.

* * * * *